(12) United States Patent
Medeiros, III

(10) Patent No.: US 8,080,872 B2
(45) Date of Patent: Dec. 20, 2011

(54) SURFACE MOUNT PACKAGE WITH HIGH THERMAL CONDUCTIVITY

(75) Inventor: Manuel Medeiros, III, Acushnet, MA (US)

(73) Assignee: HCC Aegis, Inc., New Bedford, MA (US)

( * ) Notice: Subject to any disclaimer, the term of this patent is extended or adjusted under 35 U.S.C. 154(b) by 436 days.

(21) Appl. No.: 12/456,412

(22) Filed: Jun. 16, 2009

(65) Prior Publication Data

US 2010/0013084 A1 Jan. 21, 2010

Related U.S. Application Data

(60) Provisional application No. 61/061,887, filed on Jun. 16, 2008.

(51) Int. Cl.
*H01L 23/34* (2006.01)
*H01L 23/10* (2006.01)

(52) U.S. Cl. ........ 257/720; 257/710; 257/711; 257/712; 257/E23.183

(58) Field of Classification Search .................. 257/701, 257/710–712, 720, 704, E23.183
See application file for complete search history.

(56) References Cited

U.S. PATENT DOCUMENTS

| | | | | |
|---|---|---|---|---|
| 4,025,997 | A | | 5/1977 | Gernitis et al. ............... 428/621 |
| 4,680,618 | A | | 7/1987 | Kuroda et al. ................ 257/746 |
| 4,827,082 | A | * | 5/1989 | Horiuchi et al. ............. 174/50.5 |
| 5,041,395 | A | * | 8/1991 | Steffen ........................... 29/827 |
| 5,111,277 | A | | 5/1992 | Medeiros, III et al. ....... 257/720 |
| 5,188,985 | A | | 2/1993 | Medeiros, III et al. ......... 29/832 |
| 5,886,407 | A | * | 3/1999 | Polese et al. .................. 257/706 |
| 6,355,362 | B1 | * | 3/2002 | Jones et al. ................... 428/614 |

OTHER PUBLICATIONS

Shinko Electric, "Power Transistor Dielectric Package, LCC-3 Series," To Be Provided.

* cited by examiner

*Primary Examiner* — Nitin Parekh
(74) *Attorney, Agent, or Firm* — Wiggin and Dana LLP; Gregory S. Rosenblatt

(57) ABSTRACT

A package for use in encapsulating an electronic device is disclosed. In some embodiments, the package includes the following: a dielectric frame having first and second sides, an aperture, a raised shelf portion defined along an internal perimeter of the dielectric frame and extending outwardly from the second side, the raised shelf portion defining a first thickness of the dielectric frame, and a raised sidewall extending outwardly from the second side along an external perimeter of the dielectric frame, the raised sidewall defining a second thickness of the frame, the second thickness being greater than the first thickness; a metallic component bonded to the dielectric frame and extending across the aperture; and a seam weldable, low-profile metallic seal ring bonded to the raised sidewall of the dielectric frame. In some embodiments, the package includes the following: a dielectric frame having first and second sides and an aperture, the dielectric frame having an aperture thickness bordering the aperture; a metallic insert positioned within the aperture, the metallic insert having first and second sides, the metallic insert being sized so as to be movable within the aperture and the metallic insert having an insert thickness that is greater than the aperture thickness of the dielectric frame; a first metallic component bonded to the first side of the metallic insert and extending across the aperture; and a second metallic component bonded to the second side of the metallic insert and extending across the aperture.

19 Claims, 7 Drawing Sheets

SURFACE MOUNT PACKAGE WITH HIGH THERMAL CONDUCTIVITY

CROSS REFERENCE TO RELATED APPLICATION(S)

This patent application relates to and claims priority to U.S. Patent Application Ser. No. 61/061,887 titled "Surface Mount Device with High Thermal Conductivity" that was filed on Jun. 16, 2008. U.S. Provisional Patent Application Ser. No. 61/061,887 is incorporated by reference in its entirety herein.

U.S. GOVERNMENT RIGHTS

N.A.

BACKGROUND

1. Field of the Invention

The disclosed subject matter relates generally to a package for housing an electronic circuit. More particularly, the disclosed subject matter relates to a surface mount package having a composite metal base supported by a dielectric frame with raised sidewalls and a surface mount package having a dielectric frame and floating metallic components.

2. Description of the Related Art

Increasingly complex microelectronic circuits such as silicon semiconductor integrated circuits and hybrid microelectronic circuits require packages, which both encase the circuits and provide electrical interconnection to external circuitry. One suitable package is a surface mount package ("SMT"). The SMT substrate is formed from a plurality of dielectric layers. Each dielectric layer has certain designated functions. For example, a portion of a first dielectric layer may be metallized to permit soldering of an electronic device. A second layer may have metallized circuit traces for wire bonding. Another dielectric layer may be glass sealed to a lid encasing the chip in a hermetic package. Of course, any or all layers may be for a multiplicity of functions. Metallizations extending from the circuit traces are soldered to contacts on a circuit board electrically interconnecting the package to the board.

A surface mount package is favored where a low profile package is required or the space available to mount the package is limited. As electronic devices become more complex and available space is reduced, the desirability of a surface mount package increases. Concurrently, as the device complexity increases, the heat generated by operation increases. If the heat is not removed, the temperature of the device rises shortening the operational life. It is therefore highly desirable to develop surface mount packages having high thermal conductivity.

Most dielectric surface mount packages have an alumina ($Al_2O_3$) base. Alumina is selected because its coefficient of thermal expansion is close to that of silicon integrated circuits and alumina hybrid circuits. Pre-fired alumina (green tape) is easy to stamp or otherwise shape into a desired design. After firing, a dense chemically resistant substrate is formed. $Al_2O_3$ is a poor conductor of heat, having a thermal conductivity ($T_c$) of 20 W/m-K. By comparison, copper has a $T_c$ of 393.7 W/m-K.

To improve the thermal conduction of heat from the integrated circuit device, U.S. Pat. No. 4,827,082 by Horiuchi et al discloses the use of a dielectric base having better thermal conductivity than alumina. Rather than forming the base of the package from $Al_2O_3$, AlN or SiC having a thermal conductivity in excess of 140 W/m-K is chosen for the base. The device is mounted directly to the AlN or SiC base an the patentees report an eight-fold improvement in thermal conductivity. Aluminum nitride and silicon carbide are more expensive than alumina and more difficult to shape. Care must be taken during firing to prevent oxidation of aluminum nitride back to $Al_2O_3$.

Another solution is disclosed in U.S. Pat. No. 4,025,997 to Gemitis et al. A metallic heat sink is soldered on an alumina substrate opposite the integrated circuit device. To prevent fracture of the substrate due to coefficient of thermal expansion mismatch, the heat sink is selected to be a composite material having high thermal conductivity and a relatively low coefficient of thermal expansion. Disclosed substrates include molybdenum clad copper and copper clad molybdenum. Proper selection of cladding thickness adjusts the coefficient of thermal expansion to a desired quantity. A disadvantage with this approach is that an insulative alumina layer is disposed between the integrated circuit device and the heat sink. The removal of heat from the chip is limited by the conduction of heat through the alumina layer.

An approach disclosed in a Shinko Electric publication entitled "Power Transistor Dielectric Package, LCC-3 Series" has the dielectric base sandwiched between two thin tungsten-copper plates. An integrated circuit device is mounted on an interior plate and tungsten vias interconnect the two plates to conduct heat from the device. Thermal conductivity is limited by the tungsten, $T_c$=166.1 W/m-K, and the cross-sectional area of the vias. The tungsten vias appear to occupy about 20-25% of the cross-sectional area between the two copper-tungsten plates.

Another approach is disclosed in U.S. Pat. No. 4,680,618 to Kuroda et al. A porous molybdenum or tungsten base is infiltrated with molten copper. The infiltrated base is then soldered to a dielectric frame. An electronic device is bonded directly to the infiltrated molybdenum or tungsten base. A thermal conductivity of up to 293 W/m-K is theoretically possible with this type of package.

An infiltrated base has limitations. All pores in the skeleton must be filled with the molten copper. Any air gaps will reduce thermal conductivity. When the concentration of the tungsten is high, above about 65% by volume (80% by weight), the infiltrated composite becomes difficult to shape by forging or other deformation processes. Machining is required, necessitating piece-by-piece manufacture and the generation of scrap increasing the cost of the composite.

Another surface mount package having a ceramic frame with a plurality of apertures with a copper-tungsten composite extending across each aperture is disclosed in U.S. Pat. Nos. 5,111,277 and 5,188,985, both to Medeiros, III et al. Both U.S. Pat. Nos. 5,111,277 and 5,188,985 are incorporated by reference, as if each was disclosed herein, in its entirety.

Known packages can have limitations at very low temperatures, e.g., in the cryogenic range, as found for applications in deep space. When exposed to very low temperatures, surface mount packages soldered to a printed circuit board can crack and lose hermeticity.

BRIEF SUMMARY OF THE INVENTION

The details of one or more embodiments of the invention are set forth in the accompanying drawings and the description below. Other features, objects and advantages of the invention will be apparent from the description and drawings, and from the claims.

Disclosed herein is a package for use in encapsulating an electronic device is disclosed. In some embodiments, the package includes the following: a dielectric frame having first and second sides, an aperture, a raised shelf portion defined along an internal perimeter of the dielectric frame and extending outwardly from the second side, the raised shelf portion defining a first thickness of the dielectric frame, and a raised sidewall extending outwardly from the second side along an external perimeter of the dielectric frame, the raised sidewall defining a second thickness of the frame, the second thickness being greater than the first thickness; a metallic component bonded to the dielectric frame and extending across the aperture; and a seam weldable, low-profile metallic seal ring bonded to the raised sidewall of the dielectric frame. In some embodiments, the package includes the following: a dielectric frame having first and second sides and an aperture, the dielectric frame having an aperture thickness bordering the aperture; a metallic insert positioned within the aperture, the metallic insert having first and second sides, the metallic insert being sized so as to be movable within the aperture and the metallic insert having an insert thickness that is greater than the aperture thickness of the dielectric frame; a first metallic component bonded to the first side of the metallic insert and extending across the aperture; and a second metallic component bonded to the second side of the metallic insert and extending across the aperture.

BRIEF DESCRIPTION OF THE DRAWINGS

The drawings show embodiments of the disclosed subject matter for the purpose of illustrating the invention. However, it should be understood that the present application is not limited to the precise arrangements and instrumentalities shown in the drawings, wherein.

Like reference numbers and designations in the various drawings indicated like elements.

DETAILED DESCRIPTION

Figure 1:
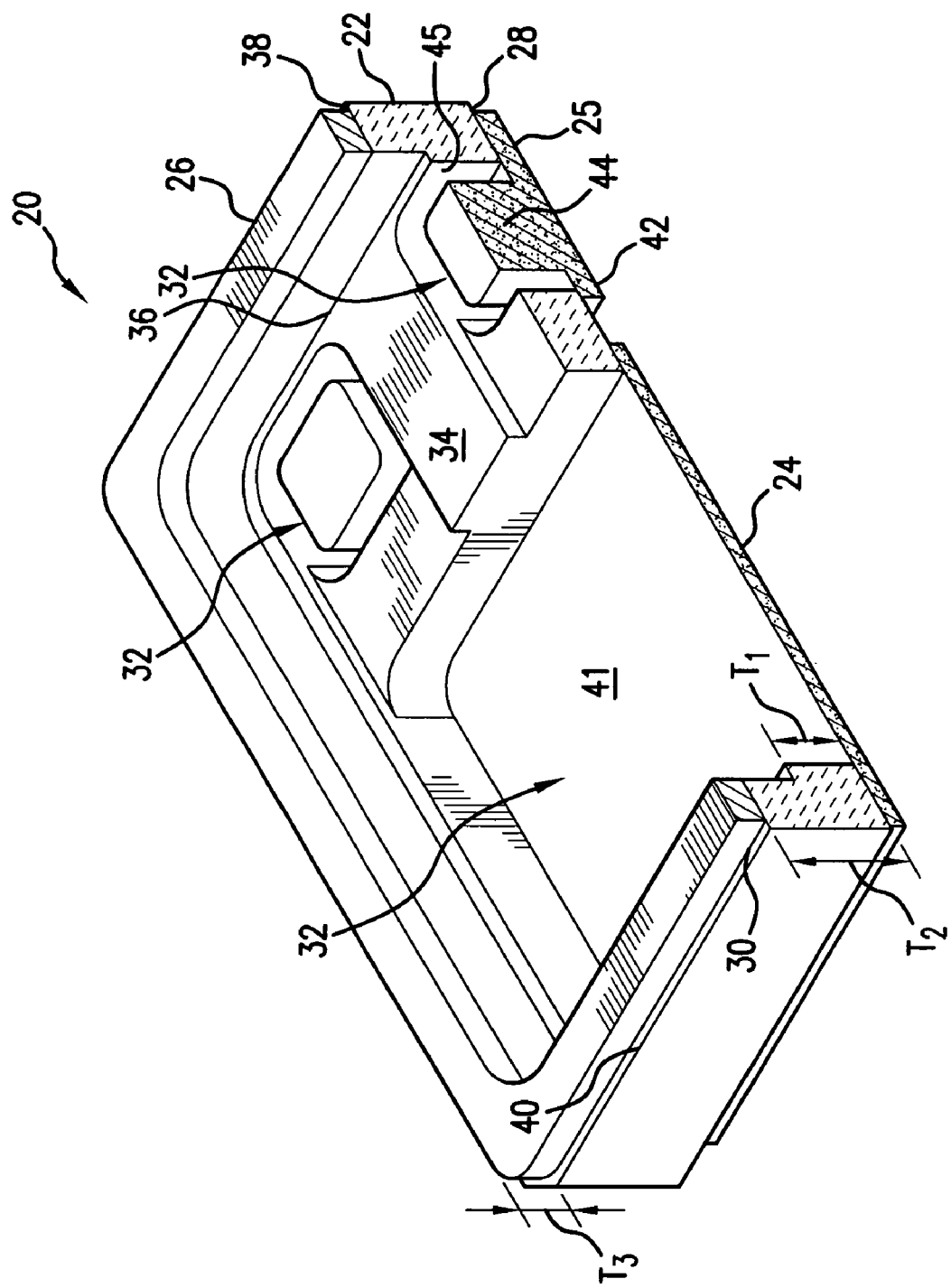
FIG. 1 is a partial front isometric view taken along line 1-1 of FIG. 2 of a package according to some embodiments of the disclosed subject matter.
Figure 2:
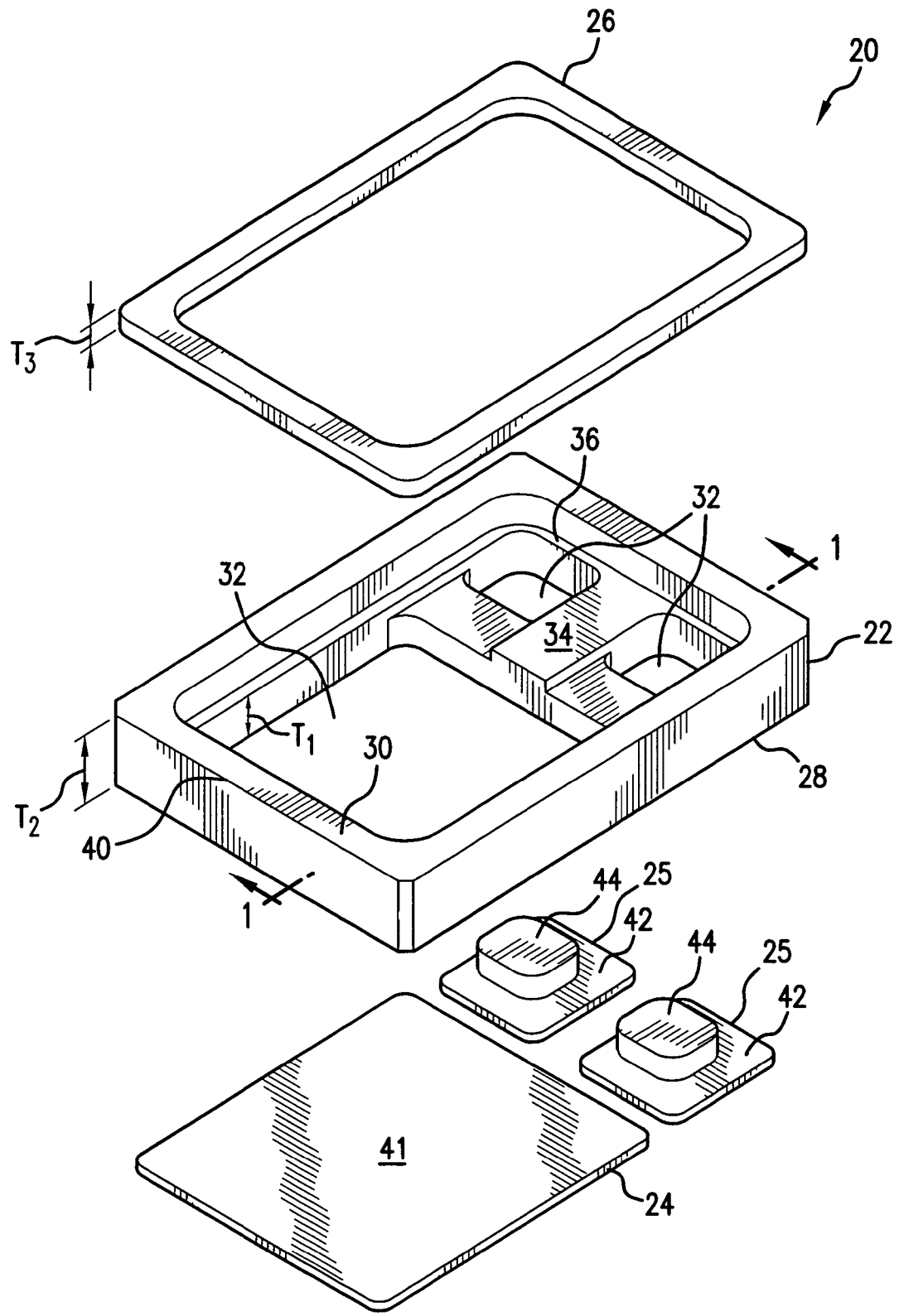
FIG. 2 is an exploded view of the package in FIG. 1.

Generally, the disclosed subject matter relates to a package for housing an electronic circuit. As shown in FIGS. 1 and 2, some embodiments include a package 20 for use in encapsulating an electronic device, such as a semiconductor based integrated circuit or a hybrid circuit having both semiconductor devices and passive devices. Package 20 typically includes a dielectric frame 22, an electrically conductive chip attach pad 24, one or more electrically conductive wire bonding pedestals 25, and a seam weldable, low-profile metallic seal ring 26, all of which are bonded together.

Dielectric frame 22 includes first and second sides, 28 and 30, respectively, an aperture or apertures 32, and a raised shelf portion 34 defined along an internal perimeter 36 of the dielectric frame and extending outwardly from the second side, and a raised sidewall 38 extending outwardly from the second side along an external perimeter 40 of the dielectric frame. Raised shelf portion 34 defines a first thickness $T_1$ of dielectric frame 22, and raised sidewall 38 defines a second thickness $T_2$ of the dielectric frame. Typically, second thickness $T_2$ is greater than first thickness $T_1$.

Dielectric frame 22 is typically manufactured from a suitable dielectric material, e.g., ceramic, that is thermally stable, chemically resistant and resistant to gas diffusion. Preferred materials are thermally stable at elevated temperatures, up to 450° C., and cryogenic temperatures, down to −65° C. One exemplary dielectric is alumina ($Al_2O_3$). Other suitable dielectrics such as aluminum nitride and silicon carbide may be used. The dielectric may include various fillers to influence its properties. For example, a pigment may be added to impart the dielectric with a desired coloration. One color is black for cosmetic reasons or to improve infrared absorption to assist soldering. In some embodiments, dielectric frame 22 is fabricated from plastic materials such as a liquid crystal polymer or similar.

Both the chip attach pad 24 and the wire bond pedestals 25 are bonded to the first side 28 of dielectric frame 22 and extend across apertures 32. The chip attach pad 24 includes a top surface 41 for receiving an integrated circuit device (not shown) and wire bond pedestals 25 include flange 42 for bonding to dielectric frame 22 and a pedestal 44 extending into aperture 32.

Both the chip attach pad 24 and the wire bond pedestals 25 are formed from a material having good thermal conductivity and a coefficient of thermal expansion close to that of the dielectric frame 22. While low expansion metals such as molybdenum and iron nickel alloys such as alloy 42 (42% nickel, remainder iron) meet these requirements, others that meet these requirements are composite materials having high thermal and electrical conductivity. Suitable materials include composites having a molybdenum or tungsten matrix and a high thermal conductivity, high electrical conductivity second phase. The second phase may be copper, silver, a copper alloy, or a silver alloy. Other suitable materials are composites of copper and tungsten. To match the coefficient of thermal expansion of the alumina substrate, the concentration of copper can be between about 5% and about 25% by weight. In some embodiments, the copper concentration is between about 10% and about 20% and in some embodiments, from about 12% to about 16%. The composite can be formed by any suitable process such as infiltration of a tungsten skeleton by molten copper or by powder metallurgy. In some embodiments, the chip attach pad 24 and the wire bond pedestals 25 are formed from a compacted mixture of powders including molybdenum, tungsten, copper, silver, and alloys thereof. In some embodiments, chip attach pad 24 and the wire bond pedestals 25 include 10% to 20% by weight copper and the balance tungsten, molybdenum, or a combination thereof. The chip attach pad 24 is typically plated with about 50 to 350 micro inches of nickel under about 40 to 60 micro inches minimum of gold as a solderable surface. The wire bond pedestals 25 are typically plated with 50-350 microinches of nickel under 50-225 microinches of soft gold (nominally 99.7%, by weight, gold).

Seam weldable, low-profile metallic seal ring 26 is bonded to raised sidewall 38 of dielectric frame 22. In some embodiments, seal ring 26 has a thickness $T_3$ that is 25 to 50 percent of second thickness $T_2$ of dielectric frame 22. In some embodiments, seal ring 26 is formed from a nickel-cobalt ferrous alloy such as that sold under the trademark Kovar® by Carpenter Technology Corporation of Reading, Pa., or similar, and in some embodiments, the seal ring plated with from about 50 to about 350 micro inches of nickel. Generally, seal ring 26 is fabricated from a material that is suitable for seam sealing. A seal ring that is seam sealed is one that is either resistance welded to a chemically etched step lid or to a flat lid that is suitable for resistance welding or soldering. The lid and seal ring enclose and seal apertures 32.

Any suitable adhesion technique can be used. One example is brazing with the copper/silver eutectic referred to as BT (nominal composition 72% copper/28% silver, eutectic at 780° C.). The braze, either as a paste or pre-form is disposed between the surfaces of dielectric frame 22 and surfaces of chip attach pad 24, wire bond pedestal flange 42 and seal ring 26.

As mentioned above, package 20 is used to house an electronic circuit. An integrated circuit device (not shown) is bonded to top surface 41 of chip attach pad and a metallic lid (not shown) is welded to seal ring 26.

The cross-sectional dimensions of the pedestal 42 are less than those of aperture 32 so that a gap 45 circumscribes the pedestal 44. The gap 45 enables the pedestal to flex and expand or contract in response to thermal or mechanical stresses without fracturing the ceramic frame 22. Sealing of flange 42 to ceramic frame 22 insures hermeticity of the package, notwithstanding the gap 45. Typically, the width of the gap is from 0.040 inch to 0.120 inch.

Figure 3:
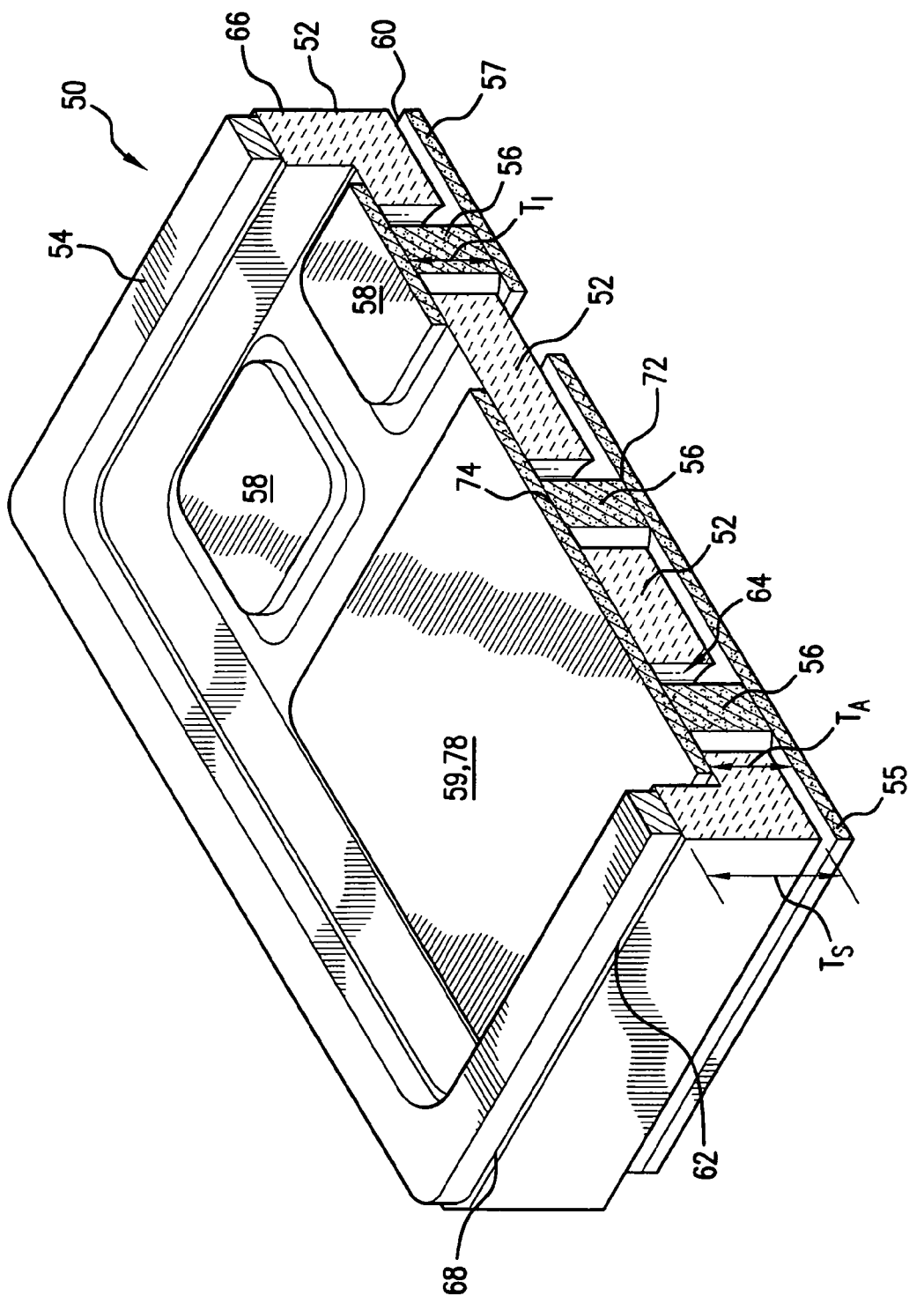
FIG. 3 is a partial front isometric view taken along line 3-3 of FIG. 6 of a package according to some embodiments of the disclosed subject matter.
Figure 4:
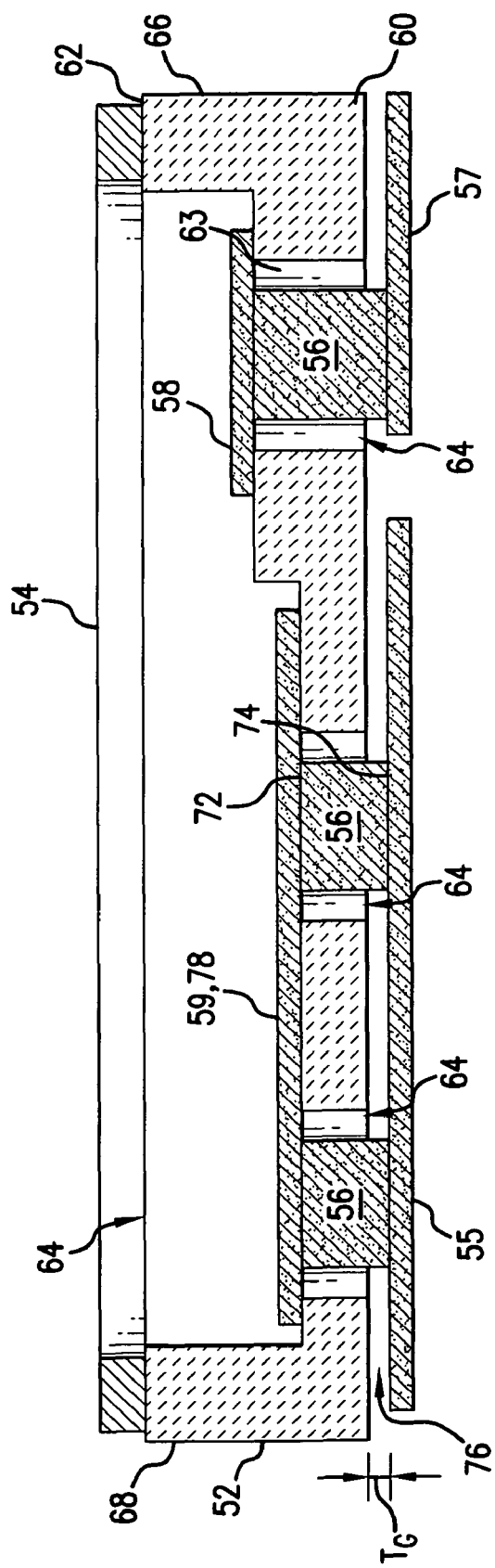
FIG. 4 is a side elevation view taken along line 3-3 of FIG. 6 of an alternative package according to some embodiments of the disclosed subject matter.
Figure 5:
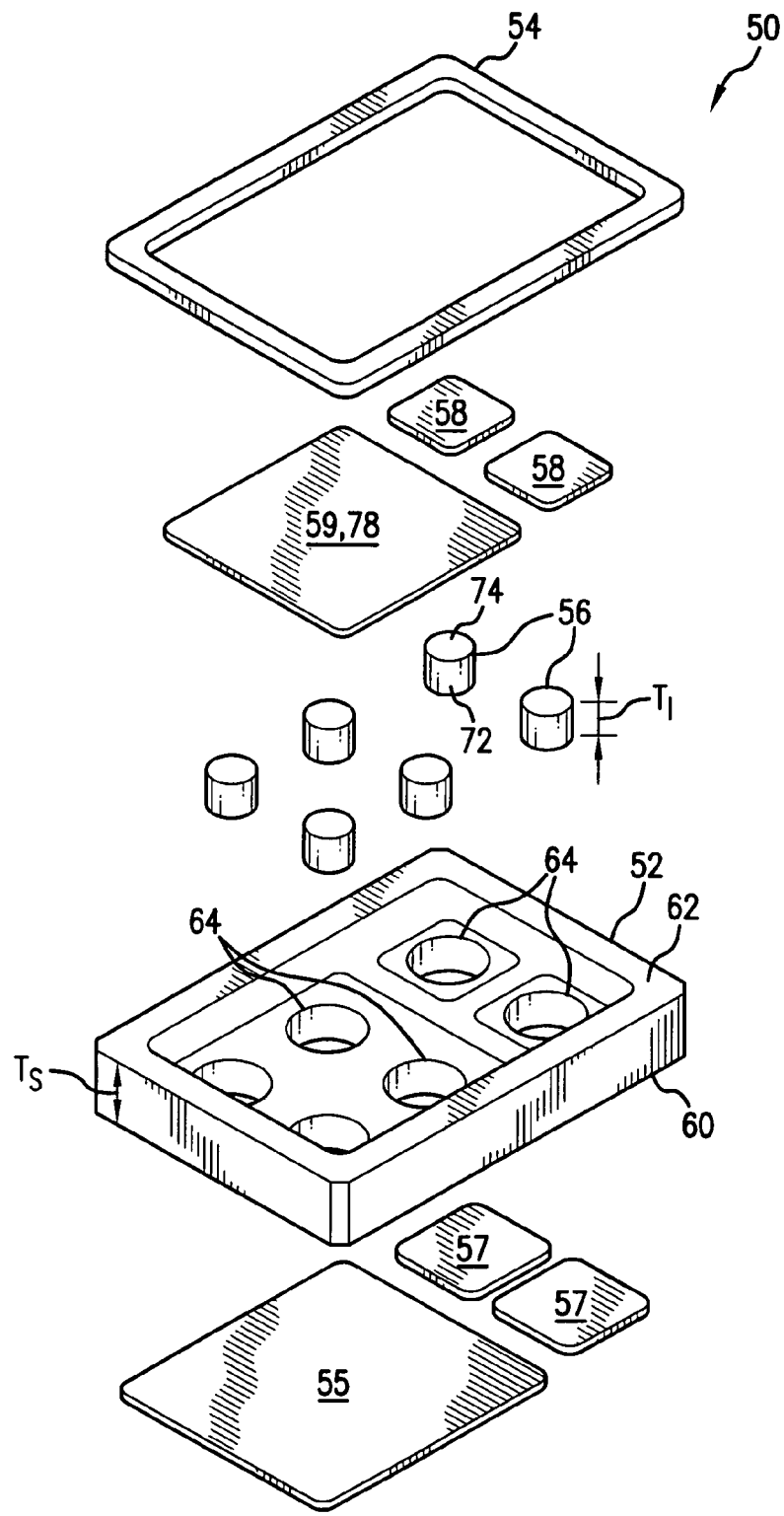
FIG. 5 is an exploded view of the package in FIG. 3.
Figure 6:
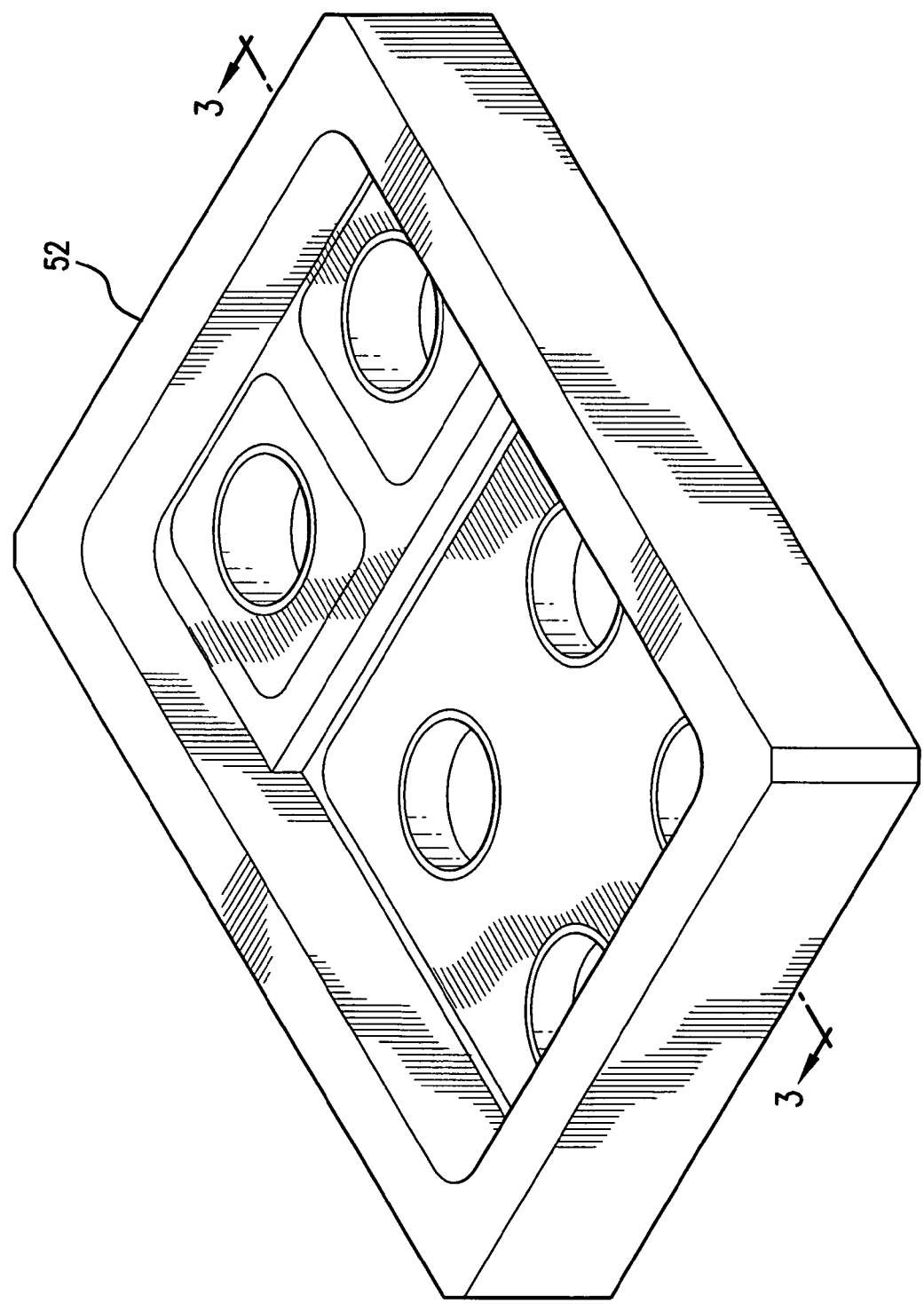
FIG. 6 is a top isometric view of a package dielectric frame according to some embodiments of the disclosed subject matter.
Figure 7:
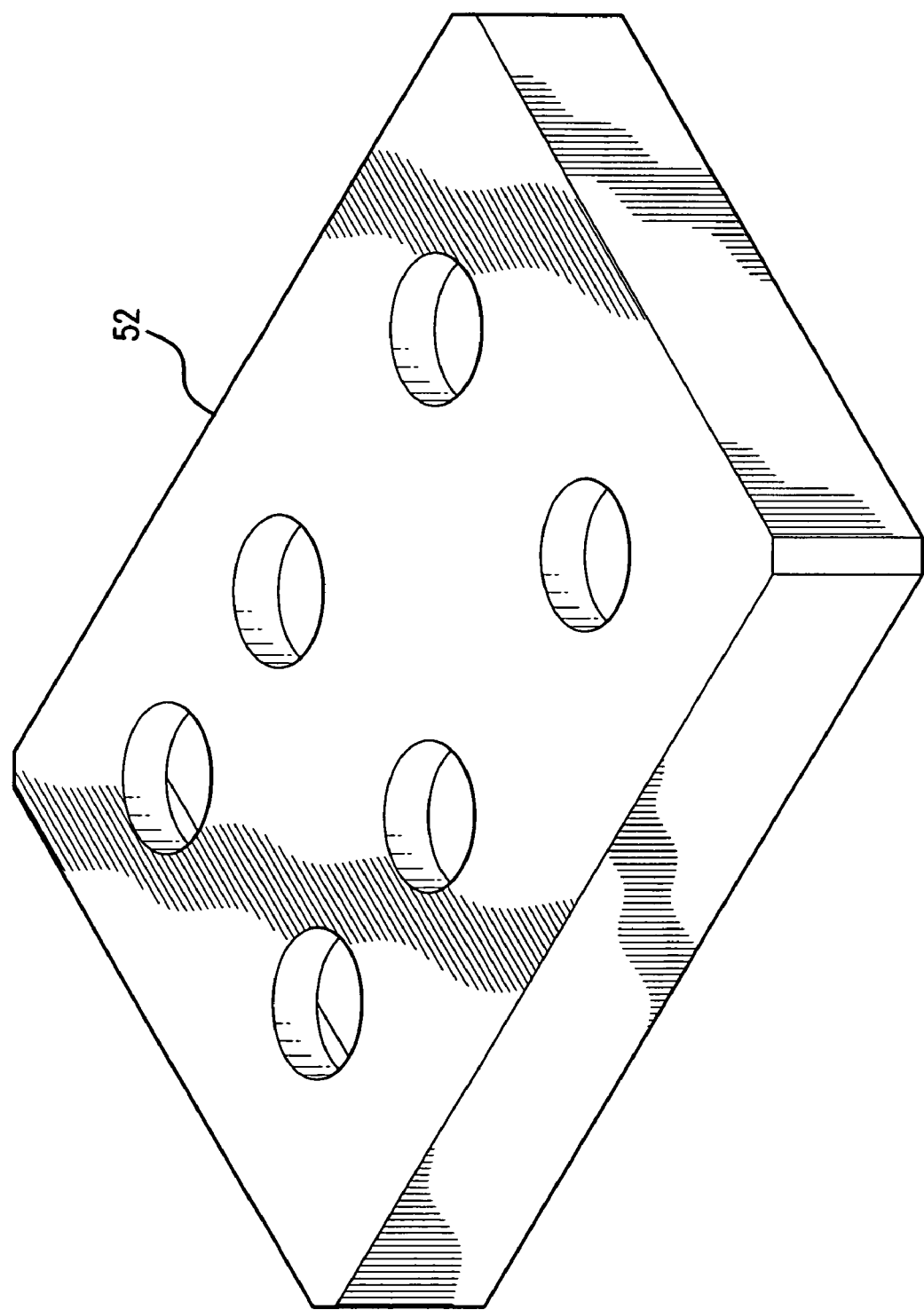
FIG. 7 is a bottom isometric view of the package dielectric frame in FIG. 6.

Referring now to FIGS. 3-7, some embodiments of the disclosed subject matter include a package 50 for use in encapsulating an electronic device. The package 50 has a dielectric frame 52 and attached a seal ring 54. A die pad base 55 and one or more wire bond bases 57 underlie chip attach pad 59 and wire bond pads 58. As best shown in FIG. 5, there is a separate wire bond base 57 associated with each wire bond pad 58. As best shown in FIG. 4, the die pad base 55 and wire bond base 57 are spaced from the dielectric frame 52 by a gap 76. Typically, the gap 76 has a width of from 0.005 inch to 0.025 inch. The chip attach pad 59 and the wire bond pads 58 are hermetically sealed to the dielectric frame, so that when a lid is joined to the seal ring 54, a hermetic enclosure is obtained. The die pad base 55 and the wire bond bases 57 are electrically interconnected to the chip attach pad 59 and the individual wire bond pads 58 by electrically conductive metallic inserts 56 that extend through apertures 64 formed in the dielectric frame 52. The dimensions of the metallic inserts 56 are such that a gap 63 circumscribes the metallic insert, separating the metallic insert 56 from walls of the aperture 64. Typically, the width, of this gap 63 is from 0.005 inch to 0.035 inch.

Dielectric frame 52 has first and second sides, 60 and 62, respectively, apertures 64, and a raised sidewall 66 that partially forms the second side and extends outwardly in a direction opposite first side 60 along an external perimeter 68 of the dielectric frame. Apertures 64 extend through dielectric frame 52 and serve as a conduit between first and second sides 60 and 62. Apertures 64 can be any geometric shape that can accommodate metallic inserts 56, e.g., substantially round or square. Dielectric frame 52 has an aperture thickness $T_A$ bordering apertures 64 and raised sidewall 66 defines a sidewall thickness $T_S$ of the dielectric frame. Sidewall thickness $T_S$ is typically greater than aperture thickness $T_A$.

Metallic seal ring 54 is bonded to second side 62 of dielectric frame 52. In some embodiments, seal ring 54 is bonded to raised sidewall 66 of dielectric frame 52.

Metallic inserts 56 are positioned within each of apertures 64, but not bonded to dielectric frame 52. Each of metallic inserts 56 has first and second sides, 72 and 74, respectively and is sized so as to be movable within a particular one of apertures 64. In some embodiments, metallic inserts 56 have an insert thickness $T_I$ that is greater than aperture thickness $T_A$ of dielectric frame 52. In some embodiments, metallic inserts 56 have an insert thickness $T_I$ that is greater than aperture thickness $T_A$ of dielectric frame 52 but less than sidewall thickness $T_S$ of the dielectric frame. Package 50 is generally fabricated from the same materials as package 20. Metallic inserts 56, which are not included in the hermetic portion of a sealed package 20, are typically fabricated from pliable conductive materials, e.g., copper and copper alloys.

The die pad base 55 and wire bond bases 57 are bonded to first side 72 of metallic inserts 56 and extend across apertures 64 but are not bonded to the dielectric frame 52 and do not seal the apertures. Wire bond pads 58 and chip attach pad 59 are bonded to second side 74 of metallic inserts 56, and extend across apertures 64. The wire bond pads 58 and chip attach pad 59 are hermetically bonded to the dielectric frame 52 sealing the apertures 64. The die pad base 55 and wire bond bases 57 are also bonded to a circuit board or other external circuit (not shown).

As best shown in FIG. 4, the metallic inserts 56 are longer than the apertures 64 so a gap 76 is defined by the die pad base 55 / wire bond bases 57 and the first side 60 of the dielectric frame 52. The gap 76 and the pliability of metallic inserts 56 allow the package 50 to flex with respect to the circuit board or other external circuitry. Metallic inserts 56 are able to flex laterally up to a distance defined by the geometry of the metallic inserts and apertures, e.g., the metallic inserts can move laterally within the apertures thereby allowing the other portions of package 50 to move laterally. The amount of flex is limited to a thickness of the gap 76.

As with package 20, package 50 is used to house an electronic circuit. An integrated circuit device (not shown) is bonded to a top surface 78 of second metallic component 58 and a metallic lid (not shown) is welded to seal ring 54.

The package 50 illustrated in FIG. 3 has chip bonding pad 59 and wire bonding pads 58 at the same elevation, that is $T_A$ is about equal to $T_I$. Alternatively, as illustrated in FIG. 4, $T_A$ may be less than $T_I$. Typically the difference in height between $T_A$ and $T_I$ is about equal to the thickness of a semiconductor device mounted on the chip bonding pad. In this way, all wire bonds are at about the same elevation facilitating automated wire bonding.

Packages according to the disclosed subject matter offer advantages over those known in the prior art. A dielectric frame including raised sidewalls is more robust and provides greater resistance to cracking, particularly in corners. Increasing the radius in corners of the dielectric frame reduces the complexity in fabrication. The raised sidewalls of the dielectric frame reduce the required thickness of the seal ring. As a result, less metallic material is required, thereby lowering the cost and the seal ring can be fabricated from a stamping process, which is easier and lower cost than grinding or extrusion processes.

A package including metallic inserts offers advantages over known packages for low temperature applications, e.g., those in the cryogenic range, which are encountered in deep space. As mentioned above, known packages, which are typically mounted to a printed circuit board, which is normally made of FR4 material, crack and loose hermeticity when a CTE mismatch occurs between the circuit board and the package. Packages having metallic inserts can absorb the CTE mismatch of the dielectric frame to the printed circuit board (FR4 material), thereby eliminating the stress that is induced by subsequent cryogenic temperatures.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention. Accordingly, other embodiments are within the scope of the following claims.

What is claimed is:

1. A package for use in encapsulating an electronic device, comprising:
   a dielectric frame having first and second sides, an aperture, a raised shelf portion defined along an internal perimeter of said dielectric frame and extending outwardly from said second side, said raised shelf portion defining a first thickness of said dielectric frame, and a raised sidewall extending outwardly from said second side along an external perimeter of said dielectric frame, said raised sidewall defining a second thickness of said dielectric frame, said second thickness being greater than said first thickness;
   a metallic component bonded to said dielectric frame and extending across said aperture;
   a seam weldable, low-profile metallic seal ring bonded to said raised sidewall of said dielectric frame, and wherein said dielectric frame is alumina and said metallic component is a compacted mixture of powders consisting essentially of molybdenum, tungsten, copper, silver, and alloys thereof.

2. A package according to claim 1, wherein said metallic component is comprised of 10% to 20% by weight copper and the balance tungsten.

3. A package according to claim 1, wherein said seal ring has a thickness that is about 15 percent of said second thickness of said dielectric frame.

4. A package according to claim 1, wherein said seal ring is one of Kovar, an iron nickel alloy, an iron nickel cobalt alloy, and a combination thereof.

5. A package according to claim 4, wherein said Kovar seal ring is plated with from about 50 to about 350 micro inches of nickel and from about 40 to about 60 micro inches of gold.

6. A package according to claim 1, wherein said metallic component has a flange for bonding to said dielectric frame and a pedestal extending into said aperture.

7. A package according to claim 6, wherein an integrated circuit device is bonded to said metallic component and a metallic lid is welded to said seal ring.

8. A package for use in encapsulating an electronic device, comprising:
   a dielectric frame having first and second sides and an aperture, said dielectric frame having an aperture thickness bordering said aperture;
   a metallic insert positioned within said aperture, said metallic insert having first and second sides, said metallic insert being sized so as to be movable within said aperture and having a gap between respective sidewalls of the metallic insert and the dielectric frame and said metallic insert having an insert thickness that is greater than said aperture thickness of said dielectric frame;
   a first metallic component bonded to said first side of said metallic insert and extending across said aperture; and
   a second metallic component bonded to said second side of said metallic insert, bonded to said second side of said dielectric frame, and extending across said aperture.

9. A package according to claim 8, wherein said dielectric frame is alumina and said metallic insert and said metallic components are a compacted mixture of powders consisting essentially of molybdenum, tungsten, copper, silver and alloys thereof.

10. A package according to claim 9, wherein said metallic insert and said metallic components are comprised of 10% to 20% by weight copper and the balance tungsten, molybdenum, or a combination thereof.

11. A package according to claim 10, further comprising a metallic seal ring bonded to a perimeter of said second side of said dielectric frame.

12. A package according to claim 11, wherein said seal ring is Kovar or an iron nickel alloy.

13. A package according to claim 12, wherein said Kovar seal ring is plated with from about 50 to about 350 micro inches of nickel.

14. A package according to claim 11, wherein an integrated circuit device is bonded to said second metallic component and a metallic lid is welded to said seal ring.

15. A package for use in encapsulating an electronic device, comprising:
   a dielectric frame having first and second sides and an aperture, said dielectric frame having an aperture thickness bordering said aperture, said dielectric frame having a raised sidewall extending outwardly from said second side along an external perimeter of said dielectric frame, said raised sidewall defining a sidewall thickness of said dielectric frame, said sidewall thickness being greater than said aperture thickness;
   a metallic insert positioned within said aperture, said metallic insert having first and second sides, said metallic insert being sized so as to be movable within said aperture and having a gap between respective sidewalls of the metallic insert and the dielectric frame and said metallic insert having an insert thickness that is greater than said aperture thickness of said dielectric frame but less than said sidewall thickness of said dielectric frame;
   a first metallic component bonded to said first side of said metallic insert and extending across said aperture;
   a second metallic component bonded to said second side of said metallic insert, bonded to said second side of said dielectric frame, and extending across said aperture; and
   a seam weldable, low-profile metallic seal ring bonded to said raised sidewall of said dielectric frame.

16. A package according to claim 15, wherein said dielectric frame is alumina and said metallic insert and said metallic components are a compacted mixture of powders consisting essentially of molybdenum, tungsten, copper, silver and alloys thereof.

17. A package according to claim 16, wherein said metallic insert and said metallic components are comprised of 10% to 20% by weight copper and the balance tungsten, molybdenum, or a combination thereof.

18. A package according to claim 17, wherein said seal ring has a thickness that is about 25-50 percent of said sidewall thickness of said dielectric frame.

19. A package according to claim 18, wherein an integrated circuit device is bonded to said second metallic component and a metallic lid is welded to said seal ring.

* * * * *